United States Patent [19]

Heime et al.

[11] Patent Number: 4,924,276

[45] Date of Patent: May 8, 1990

[54] OPTOELECTRONIC COMPONENT

[75] Inventors: Axel Heime, Heilbronn-Sontheim; Gerhard Rosin-Schröder, Heilbronn; Werner Schairer, Weinsberg, all of Fed. Rep. of Germany

[73] Assignee: Telefunken electronic GmbH, Heilbronn, Fed. Rep. of Germany

[21] Appl. No.: 235,311

[22] Filed: Aug. 17, 1988

[30] Foreign Application Priority Data

Aug. 18, 1987 [DE] Fed. Rep. of Germany ....... 3727488

[51] Int. Cl.⁵ ................... H01L 33/00; H01L 23/48; H01L 27/14
[52] U.S. Cl. .................. 357/17; 357/68; 357/65; 357/70; 357/71; 357/30
[58] Field of Search ............ 357/17, 58, 65, 70, 357/71, 30

[56] References Cited

U.S. PATENT DOCUMENTS

| | | |
|---|---|---|
| 3,737,704 | 6/1973 | Grenon et al. ............... 313/108 D |
| 4,027,319 | 5/1977 | Borrello et al. ............. 357/17 |
| 4,145,707 | 3/1979 | Sadamasa et al. ............ 357/68 |
| 4,244,002 | 1/1981 | Sato et al. ................. 357/68 |
| 4,633,280 | 12/1986 | Takasu ...................... 357/17 |

FOREIGN PATENT DOCUMENTS 0176173  8/1986  Japan .................. 357/30 L

OTHER PUBLICATIONS

IEEE Transactions on Electron Devices, vol. ED-20, No. 11, Nov. 1973.

Primary Examiner—Rolf Hille
Assistant Examiner—Minh Loan Tran
Attorney, Agent, or Firm—Spencer & Frank

[57] ABSTRACT

Optoelectronic components, in particular those comprising a line of luminescent diodes arranged in a row, are provided according to the prior art with contacts that have a number of disadvantages, some of which are that the light efficiency is relatively low and that irregularities in the light efficiency of a row occur due to incorrect adjustments of the contacts. According to the invention the contact is therefore designed as a contact bridge passing transversely over the contact window, so that on the one hand only a small amount of light-emitting surface is covered and a high light power thereby attained, and on the other hand the regularity of the light efficiency is independent of any misalignment of the contact bridge.

8 Claims, 2 Drawing Sheets

OPTOELECTRONIC COMPONENT

BACKGROUND OF THE INVENTION

The invention relates to an optoelectronic component that is made from a semiconductor element containing at least one p-n junction and that has one rear contact on the semiconductor element and one front contact in a contact window located in a passivation layer, and to the use of this optoelectronic component.

Optoelectronic components are being used increasingly in various fields for a wide variety of applications. For example, luminescent diodes are used as indicator lights and displays and for the construction of line arrays and flat screens.

FIG. 1 is a diagram of a line array of luminescent diodes for use as a print head, as is known from the book "Light Emitting diodes, An Introduction", by K. Gillessen and W. Schairer, published by Prentice Hall International, 1987, on page 225, FIGS. 7–9. In this case the p-n junctions 2 forming the light-emitting diodes are provided in a semiconductor element 1 and extend to a surface covered with a passivation layer 3, at which surface the emitting surfaces of the light-emitting diodes are defined by the p-n junctions 2, and the contact windows 6 are located in the passivation layer 3 within these light-emitting surfaces. The rear contact 4 covers the entire rear area of the semiconductor 1, while the front contacts 5 are placed like a frame around each contact window 6 and each merge with a conducting path 7 on one side of the contact windows 6.

The contacting arrangement of the individual luminescent diodes according to this prior art has substantial drawbacks. On the one hand, a large proportion of the emitting surface 2 is covered by the contact 5, so that the mean light efficiency is relatively low. On the other hand, the emitted light power, the uniformity of the light power from all the luminescent diodes and the electrically contacted surface depends on exact adjustment of the contacts, whereas misalignments can lead to considerable irregularities.

SUMMARY OF THE INVENTION

The object underlying the invention is therefore to indicate an optoelectronic component of the type mentioned at the outset whose contact covers only a small part of the contact window and which ensures regularity of the light efficiency even in the event of misalignment.

The object is attained in accordance with the invention in an optoelectronic component of the type described at the outset by the front contact comprising a narrow contact bridge passing transversely over the contact window in such a way that it projects beyond the window on both sides and divides the window into two areas.

In an advantageous embodiment the contact bridge can be designed so narrow that it takes up not more than one quarter of the contact window area. The contact bridge preferably merges on one side into an adjoining conducting path that widens out in cone form, the width of the contact bridge being selectable between 5 and 10 μm in a suitable embodiment when the contact windows are designed square with an edge length of approx. 40 μm.

It has proved particularly advantageous to run the contact bridge largely over the centre of the contact window, as misalignments of almost half the width of the contact window in either direction do not then lead to a change in the light efficiency.

In a further embodiment of the invention a large number of light-emitting diodes arranged in a row and integrated in a common semiconductor element can be provided with contact bridges, the diodes running parallel to one another and the adjoining conducting paths being arranged alternately on each side of the light-emitting diode row.

An optoelectronic component in accordance with the invention can be used in a particularly advantageous way for the construction of displays printer lines and screens.

BRIEF DESCRIPTION OF THE DRAWINGS

The optoelectronic component according to the invention will now be described in more detail with reference to the embodiment on the basis of the drawing.

FIG. 2b shows a section along the line A-B of the luminescent diode according to the FIG. 2a. FIG. 2c shows a plan view of two adjacent luminescent diodes according to FIG. 2a.

DESCRIPTION OF THE PREFERRED EMBODIMENTS

Figure 1:
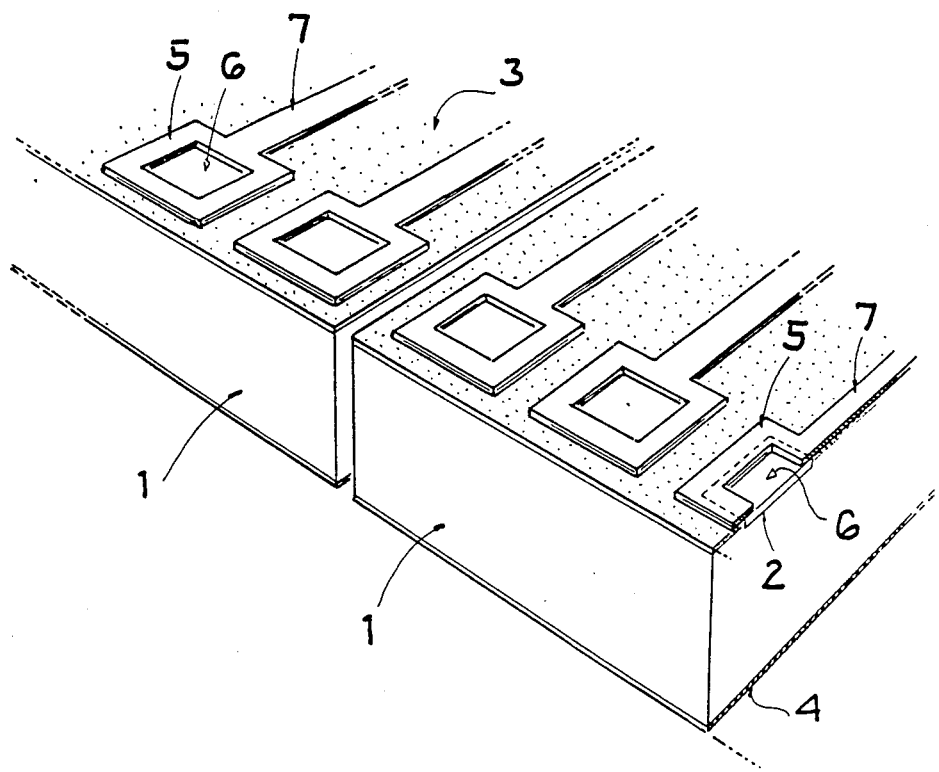
Figure 2A:
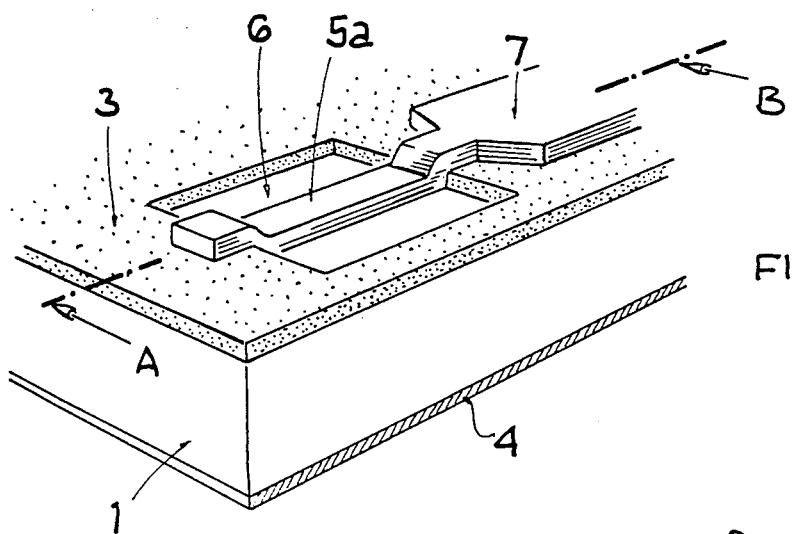
FIG. 2a shows a perspective partial view of a luminescent diode according to the invention.
Figure 2B:
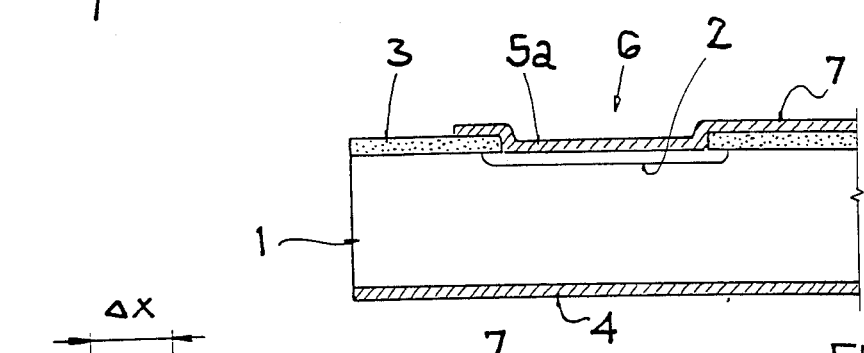
Figure 2C:
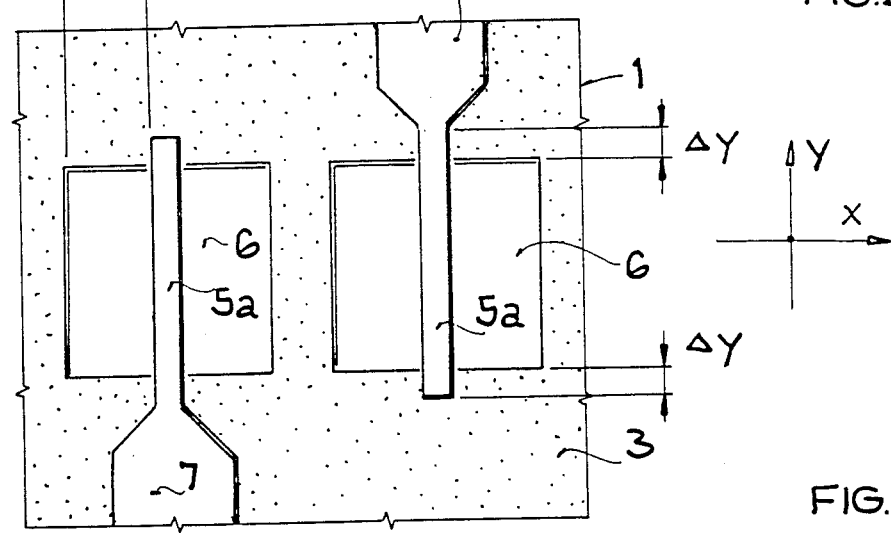

FIGS. 2a to 2c show a semiconductor element 1 of monocrystalline semiconductor material of gallium phosphide or gallium arsenide or a mixed crystal between them in which one or more diodes are formed by diffusion or implantation of p-n junctions 2. The p-n junctions 2, which substantially limit the emitting surface of the light-emitting diodes, extend to a surface covered with a passivation layer 3 and in which are located contact windows 6 within the area defined by the p-n junctions. The contact windows 6 are, for example, designed square with an edge length of approx. 40 μm. The rear contact 4 covers the entire rear area of the semiconductor element 1, while the front contact is designed as a narrow contact bridge 5a with a width of approx. 8 μm. This contact bridge 5a passes transversely over the contact window 6 in such a way that it projects approx. 10 μm beyond the contact window on both sides, as shown in FIG. 2b. The contact bridge 5a then merges on one side into an adjoining conducting path 7 that widens out in cone form onto the passivation layer 3, this path having a width of approx. 40 μm as is clearly shown in FIGS. 2a and 2c.

FIG. 2c also shows that the contact bridge 5a passes over the centre of the contactwindow 6 in order to permit the greatest possible misalignment of the contact bridges. FIG. 2c shows, with 2 diodes, a section from a row-type diode line, with the adjoining conducting paths 7 being arranged alternately on opposite sides of the row.

In the contact structure according to the invention the emitted light efficiency is relatively high, since only a small proportion of the light-emitting surface 6 is covered by the narrow contact bridge.

A misalignment of the contact bridges 5a in either the X or the Y direction affects neither the emitted light efficiency and electrically contacted surface nor the regularity of the light power of all the luminescent diodes of a line. This is due to the fact that the contact bridge can be misaligned both in the X and in the Y direction by a distance Δx or Δy respectively, without thereby altering the size of the covered light-emitting surface. In addition, it is possible with a luminescent diode line to turn the individual contacts 5a in relation to one another by a small angle without increasing the irregularity of the light efficiency.

This contact structure of the luminescent diode according to the invention therefore avoids all drawbacks entailed by the prior art.

What is claimed is:

1. An optoelectronic component that is made from a semiconductor element (1) containing at least one p-n junction (2), and that has one rear contact (4) on the semiconductor element (1) and one front contact (5) in a contact window (6) located in a passivation layer (3), wherein the front contact (5) comprises a narrow contact bridge (5a) passing transversely over the contact window (6) in such a way that it projects beyond said window (6) on both sides and divides said window (6) into two areas.

2. An optoelectronic component according to claim 1, wherein the contact bridge (5a) is designed so narrow that it takes up not more than one quarter of the area of the contact window (6).

3. An optoelectronic component according to claim 2, wherein the contact bridge (5a) merges into an adjoining conducting path (7) that widens into a cone shape.

4. An optoelectronic component according to claim 2, wherein the width of the contact bridge (5a) is between 5 and 10 $\mu$m in a contact window (6) designed square and having an edge length of approx. 40 $\mu$m.

5. An optoelectronic component according to claim 4, wherein the contact bridge (5a) has a width of approx. 8 $\mu$m and the contact bridge (5a) passes largely over the centre of the contact window (6).

6. An optoelectronic component according to claim 2, wherein a large number light-emitting diodes arranged in a row and integrated in a common semiconductor element (1) are provided with contact bridges (5a).

7. An optoelectronic component according to claim 6, wherein the contact bridge (5a) of the light-emitting diodes run parallel to one another on the semiconductor element (1) and the adjoining conducting paths (7) are arranged alternately on each side of the light-emitting diode row.

8. In a display, printer line or screen, the improvement comprising the optoelectronic component according to claim 1.

* * * * *